US012590381B2

(12) United States Patent
Lai et al.

(10) Patent No.: US 12,590,381 B2
(45) Date of Patent: Mar. 31, 2026

(54) ELECTROPLATING SYSTEM INCLUDING AN IMPROVED BASE STRUCTURE

(71) Applicant: Taiwan Semiconductor Manufacturing Company, Ltd., Hsinchu (TW)

(72) Inventors: Chia-Sheng Lai, Taipei (TW); Chun-Yuan Hsu, Hsinchu (TW); Tzu-Chung Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 1012 days.

(21) Appl. No.: 17/680,176

(22) Filed: Feb. 24, 2022

(65) Prior Publication Data

US 2023/0146080 A1 May 11, 2023

Related U.S. Application Data

(60) Provisional application No. 63/278,108, filed on Nov. 11, 2021.

(51) Int. Cl.
C25D 21/08 (2006.01)
C25D 7/12 (2006.01)
(Continued)

(52) U.S. Cl.
CPC .............. C25D 21/08 (2013.01); C25D 7/12 (2013.01); C25D 17/001 (2013.01); C25D 17/06 (2013.01); H01L 21/67051 (2013.01)

(58) Field of Classification Search
CPC .......... C25D 7/12; C25D 17/001; C25D 3/38; C25D 17/06; C25D 17/10; C25D 21/08
See application file for complete search history.

(56) References Cited

U.S. PATENT DOCUMENTS 5,169,408 A * 12/1992 Biggerstaff ....... H01L 21/67023
134/155
6,270,647 B1 * 8/2001 Graham .............. H01L 21/6719
204/286.1
(Continued)

FOREIGN PATENT DOCUMENTS

CN 1508296 A 6/2004
TW 200720488 A 6/2007

OTHER PUBLICATIONS

Krill ("III. The Effects of Shields and Baffles on the Distribution of Functional Chromium Electrodeposits," NASF Surface Technology White Papers 2018, 82(11), 21-32). (Year: 2018).*
(Continued)

*Primary Examiner* — James Lin
*Assistant Examiner* — Kevin Sylvester
(74) *Attorney, Agent, or Firm* — KILPATRICK TOWNSEND & STOCKTON LLP

(57) ABSTRACT

A base structure in an electroplating system is provided. The base structure includes: includes: an annular member; a contact ring attached to an inner surface of the annular member and configured to be electrically connected to a wafer in an electroplating process; and a pair of shield structures attached to an upper surface of the annular member and extending in an vertical direction. Each of the pair of shield structures includes: a curved plate comprising a plurality of discharging openings, wherein plating solution residual is discharged through the plurality of discharging openings in a cleaning procedure; and a plurality of bevels, each of the plurality of bevels corresponding to each of the plurality of discharging openings and configured to guide the plating solution residual toward the corresponding discharging opening in the cleaning procedure.

20 Claims, 7 Drawing Sheets

(51) Int. Cl.

| | | |
|---|---|---|
| *C25D 17/00* | (2006.01) | |
| *C25D 17/06* | (2006.01) | |
| *H01L 21/67* | (2006.01) | |

(56) References Cited

U.S. PATENT DOCUMENTS

| | | | | |
|---|---|---|---|---|
| 6,610,182 | B2 * | 8/2003 | Sakaki | C25D 17/001 |
| | | | | 204/297.08 |
| 9,309,603 | B2 * | 4/2016 | Woodruff | C25D 17/004 |
| 2003/0101929 | A1 | 6/2003 | Yoshihara et al. | |
| 2004/0140199 | A1 * | 7/2004 | Mizohata | C25D 17/001 |
| | | | | 257/E21.175 |
| 2010/0155254 | A1 * | 6/2010 | Prabhakar | C25D 17/001 |
| | | | | 204/297.05 |
| 2013/0292254 | A1 * | 11/2013 | Kumar | C25D 21/00 |
| | | | | 134/1 |
| 2014/0083862 | A1 * | 3/2014 | Harris | C25D 17/001 |
| | | | | 204/278 |
| 2019/0233966 | A1 * | 8/2019 | Hanson | C25D 21/08 |
| 2024/0218552 | A1 * | 7/2024 | Yamamoto | C25D 17/001 |

OTHER PUBLICATIONS

The Notice of Allowance and search report issued in Taiwanese corresponding application 111115606, mailed on Dec. 31, 2025.

* cited by examiner

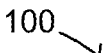
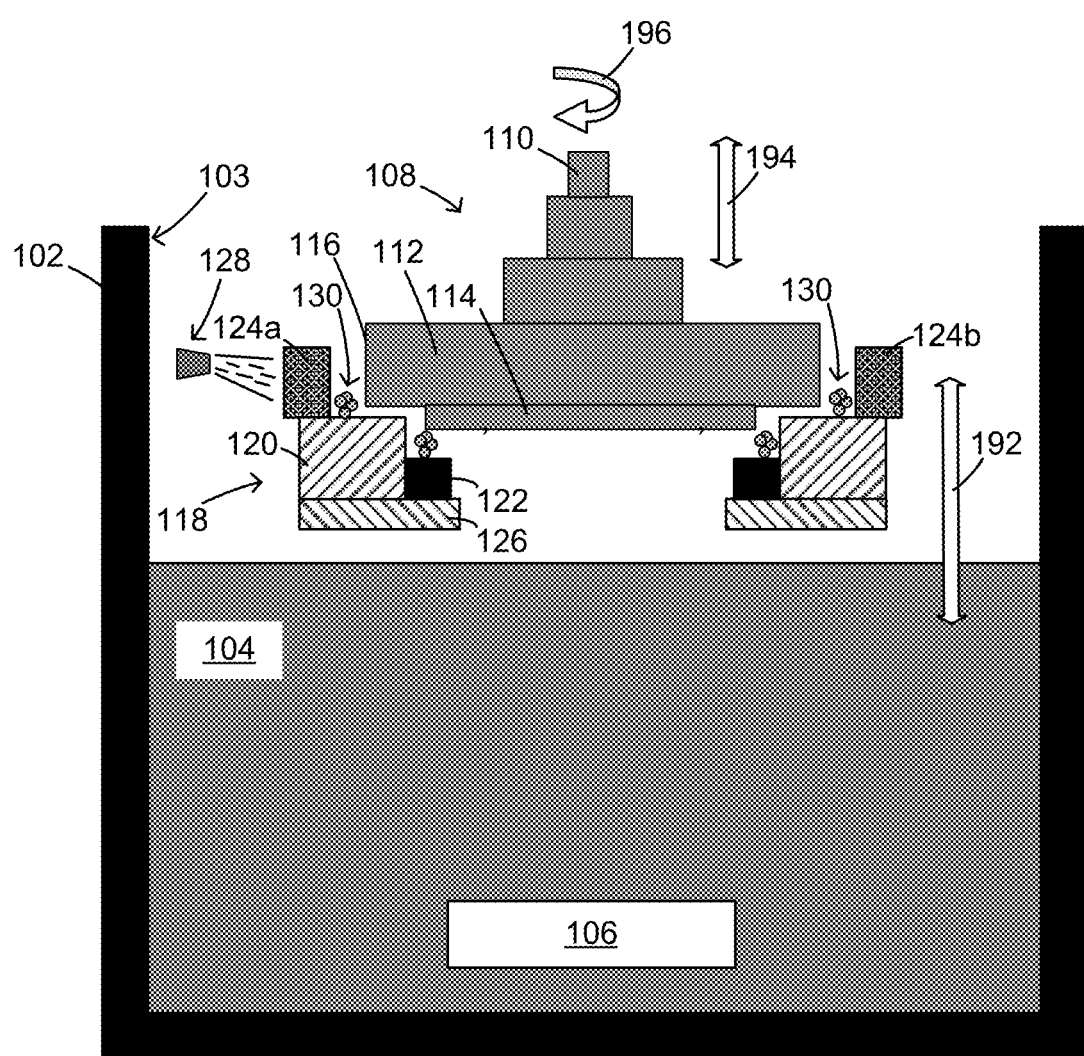
FIG. 2

600

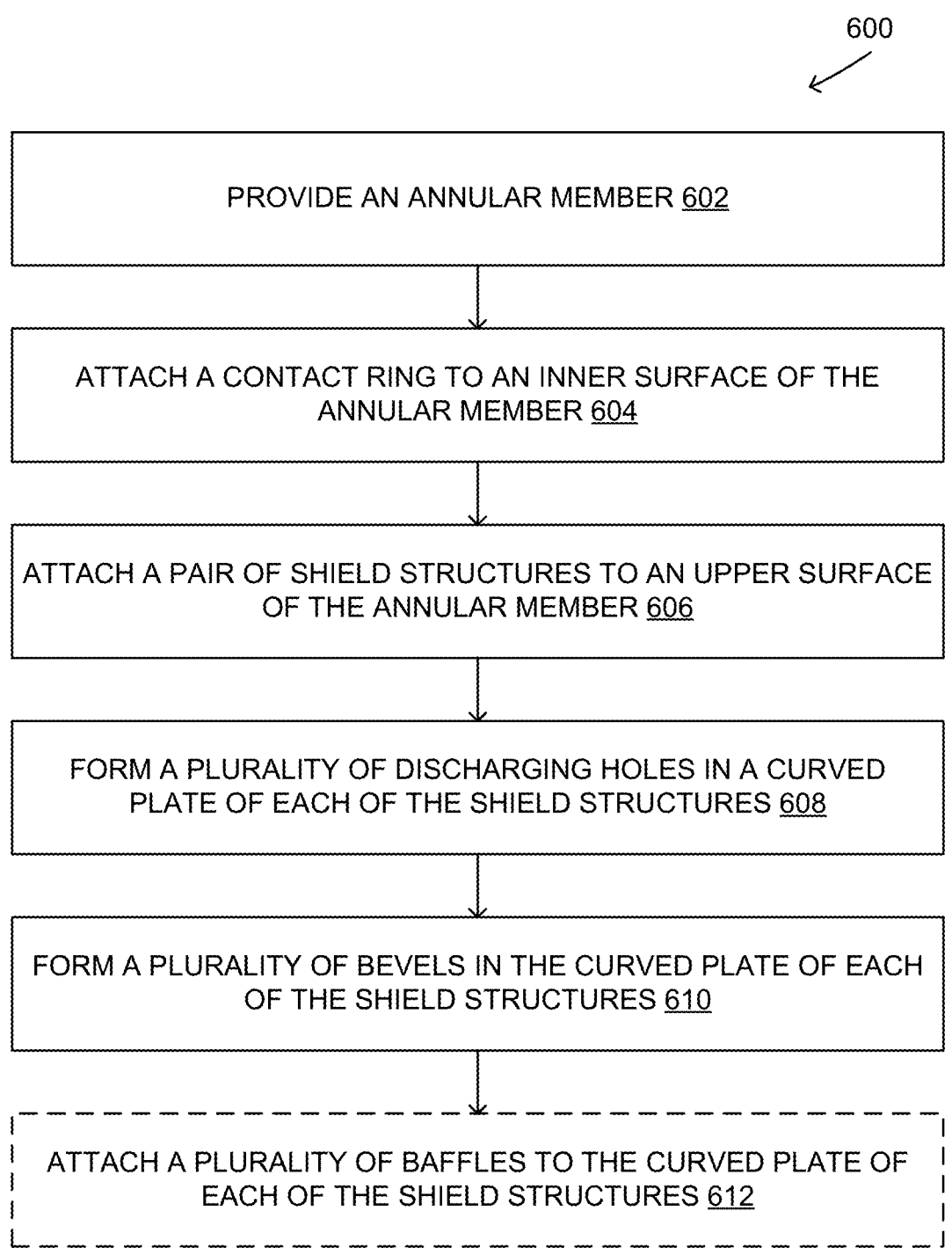

PROVIDE AN ANNULAR MEMBER 602

ATTACH A CONTACT RING TO AN INNER SURFACE OF THE ANNULAR MEMBER 604

ATTACH A PAIR OF SHIELD STRUCTURES TO AN UPPER SURFACE OF THE ANNULAR MEMBER 606

FORM A PLURALITY OF DISCHARGING HOLES IN A CURVED PLATE OF EACH OF THE SHIELD STRUCTURES 608

FORM A PLURALITY OF BEVELS IN THE CURVED PLATE OF EACH OF THE SHIELD STRUCTURES 610

ATTACH A PLURALITY OF BAFFLES TO THE CURVED PLATE OF EACH OF THE SHIELD STRUCTURES 612

REMOVE THE WAFER 702

ROTATE THE BASE STRUCTURE AND THE WAFER HOLDER ASSEMBLY 704

EJECT CLEANING LIQUID TOWARD THE BASE STRUCTURE 706

ELECTROPLATING SYSTEM INCLUDING AN IMPROVED BASE STRUCTURE

CROSS-REFERENCES TO RELATED APPLICATIONS

The present application claims priority to U.S. Provisional Patent Application No. 63/278,108, filed on Nov. 11, 2021, the entire disclosure of which is incorporated herein by reference.

FIELD

Embodiments of the present disclosure relate generally to semiconductor electroplating systems, and more particularly to mechanisms of reducing crystallization residual in semiconductor electroplating systems.

BACKGROUND

Semiconductor devices are used in a variety of electronic applications, such as personal computers, cell phones, digital cameras, and other electronic equipment. The semiconductor industry continues to improve the integration density of various electronic components (e.g., transistors, diodes, resistors, capacitors, etc.) by continual reductions in minimum feature size, which allows more components to be integrated into a given chip area.

During the manufacturing of the semiconductor devices, various processing steps are used to fabricate integrated circuits on a semiconductor wafer. Examples of processing steps include surface passivation, photolithography, ion implantation, etching, plasma ashing, thermal treatments, chemical vapor deposition (CVD), atomic layer deposition (ALD), physical vapor deposition (PVD), molecular beam epitaxy (MBE), electroplating, chemical-mechanical polishing (CMP), and the like. Various semiconductor processing equipment and tools (e.g., extreme ultraviolet (EUV) lithography systems) have been developed for those processing steps. There is a need to improve the performance and reduce maintenance cost of those semiconductor processing equipment and tools.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a diagram illustrating the example electroplating system shown in FIG. 1 in a cleaning procedure in accordance with some embodiments.

FIG. 6 is an example method of manufacturing a base structure in an electroplating system in accordance with some embodiments.

DETAILED DESCRIPTION OF THE INVENTION

Figure 1:
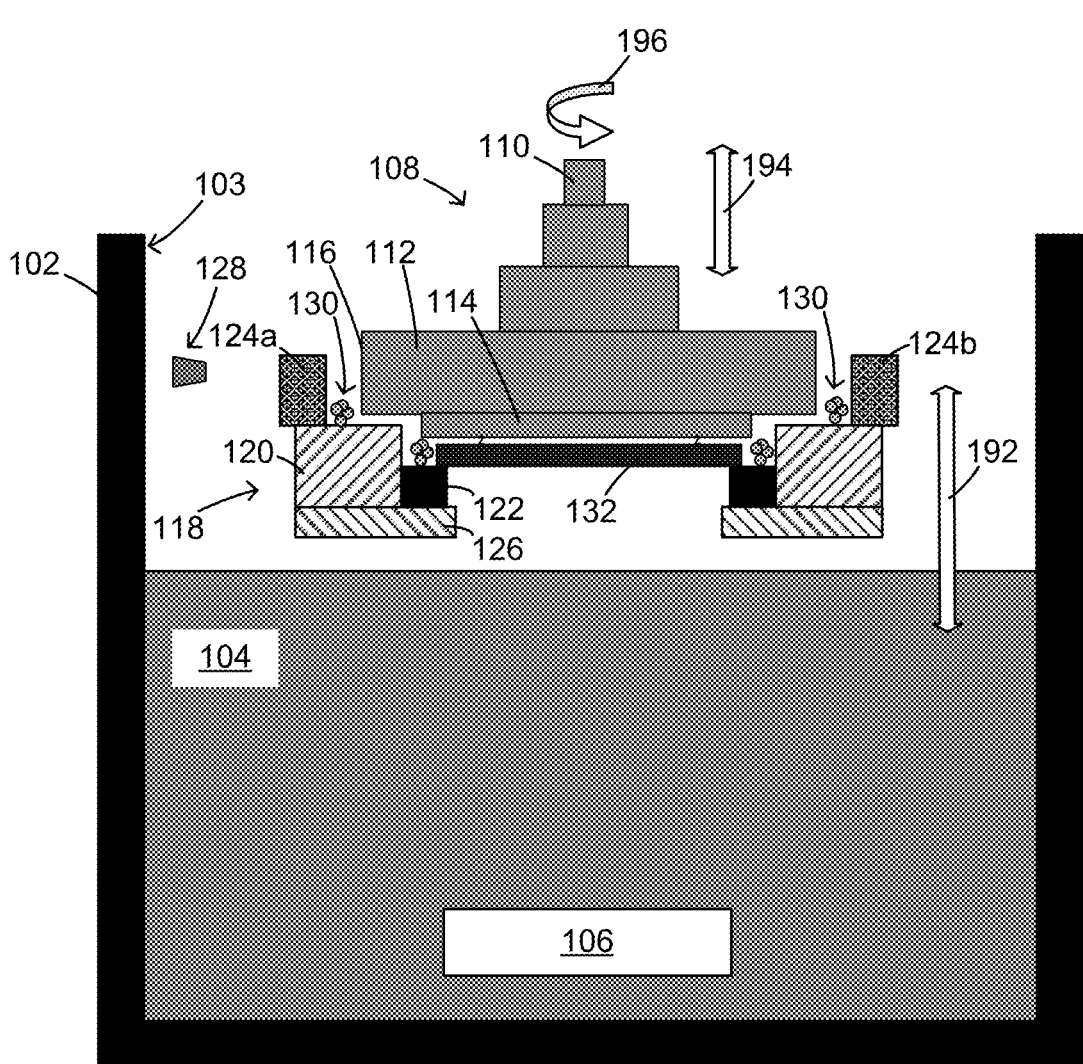
FIG. 1 is a diagram illustrating an example electroplating system in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

The electroplating processes are used for deposition of conductive layers over the semiconductor wafer. Generally, an electroplating process includes depositing or plating positively charged ions (e.g., metal ions) onto a negatively charged substrate (e.g., a semiconductor wafer), which is used as a source of electrons. In one implementation, a seed layer (or a metal layer) is first deposited over the semiconductor wafer to provide an electrical path across the surfaces. An electrical current is then supplied to the seed layer or the metal layer, thereby electroplating the semiconductor wafer surface with an appropriate metal (e.g., copper, aluminum, or any suitable metallic material).

One typical example of electroplating processes is copper electroplating, which may be used to create copper interconnects and vertical interconnect accesses (vias) that link components together in an integrated circuit (IC). In the example of copper electroplating, a silicon wafer and a copper source are placed in a plating solution (sometimes also referred to as a "plating bath"), which typically contains copper sulfate ($CuSO_4$) and sulfuric acid. When a current is applied, copper ions deposit on the wafer over time. The amount of copper deposited on the wafer is directly controlled by the current flow, which supplies electrons needed for the cupric ion reduction reaction (i.e., $Cu^{2+}+2e^- \to Cu$). Additionally, parameters such as the temperature of the plating solution, the rate of the plating solution flow, and the chemical composition of the plating solution can be adjusted to control the properties of the copper layer that is deposited over the wafer. It should be understood that although the disclosure uses copper electroplating as an example, the inventive concepts in the disclosure are generally applicable to the electroplating of other materials as needed.

Electroplating process is typically conducted using an electroplating system. The electroplating system generally includes, among other things, a container which accommodates the plating solution, an anode immersed in the plating solution, a wafer holder assembly which holds the wafer from the above, and a base structure (also referred to as a "cup") which supports the wafer from the bottom and provides the electrical connection between the wafer and a low (electric) potential (i.e., causing the wafer to act as a cathode which attracts positive ions). In other words, the wafer that is going to be electroplated is located between the base structure and the wafer holder assembly. During the electroplating process, the wafer holder assembly, the base structure, and the wafer therebetween rotate together at the same speed. Plating solution residual (e.g., $CuSO_4$ crystal in the example of copper electroplating) may accumulate over the base structure and/or the wafer holder assembly over time. Thus, periodic or occasional cleaning procedures are necessary to remove the accumulated plating solution residual. The cleaning procedure reduces the usage and increases the maintenance time of the electroplating system in a foundry, consumes a significant amount of water and energy, and requires the involvement of applied engineers, which may be a critical human resource in a foundry.

More importantly, the base structure typically has some shield structures extending in the vertical direction and configured to protect the wafer, the wafer holder assembly, and the base structure. As a result, some right-angle corners exist in the base structures. Plating solution residual may accumulate at those right-angle corners easily and may be very challenging to clean using conventional cleaning procedures. Automatic cleaning procedures sometimes are not good enough to clean the plating solution residual accumulated at those right-angle corners. Therefore, manual cleaning, which is inefficient and labor-intensive, might be inevitable.

On the other hand, uncleaned plating solution residual may result in high impedance between the wafer and the base structure, which in turn increases power consumption of the electroplating system during the electroplating process. In some cases, the high impedance may even cause the electroplating process to be interrupted. Accordingly, maintaining a relatively low impedance between the wafer and the base structure by reducing the plating solution residual, is very meaningful.

In accordance with some aspects of the disclosure, improved electroplating systems having an improved base structure and corresponding methods are provided for addressing the aforementioned plating solution residual problem. In some embodiments, the base structure in accordance with the disclosure includes a pair of shield structures. Each of the shield structures, in those embodiments, includes three features: (1) discharging openings; (2) bevels; and (3) baffles. In one embodiment, a shield structure includes discharging openings. In one embodiment, a shield structure includes discharging openings and bevels. In another embodiment, a shield structure includes discharging openings and baffles. In yet another embodiment, a shield structure includes discharging openings, bevels, and baffles. In that embodiment, the bevels are configured to guide plating solution residual toward the corresponding discharging openings in a cleaning procedure. In various embodiments, the plating solution residual is discharged through the discharging openings in a cleaning procedure. In those embodiments, the baffles prevent the plating solution residual from reentering the base structure through the discharging openings. Details of these features will be described below with reference to FIGS. 1-7. As a result, these techniques enable, among other benefits, the following benefits: increasing discharging efficiency of the plating solution residual; consuming less water and energy during the cleaning procedure; increasing usage and reducing the maintenance time of the electroplating system; and reducing the necessary human involvement and saving critical human resource in a foundry. Moreover, adding the shield structure having one or more of these aspects is cost-effective.

FIG. 1 is a diagram illustrating an example electroplating system 100 in accordance with some embodiments. In the example of FIG. 1, the electroplating system 100 includes, among other things, a container 102, a wafer holder assembly 108, a base structure (also referred to as a "cup") 118, an anode 106, and a cleaning nozzle. The container 102 accommodates plating solution 104. The anode 106 is immersed in the plating solution 104.

The wafer holder assembly 108 is configured to hold a wafer 132 to be electroplated. In the example of FIG. 1, the wafer holder assembly 108 includes a rotatable spindle 110 that can rotate around a vertical axis, as denoted as rotational movement 196 in FIG. 1. The rotation of the rotatable spindle 110 causes the wafer holder assembly 108 and the wafer 132 to rotate at the same speed. The wafer holder assembly 108 further includes a wafer holder body 112 and a wafer attachment member 114. In some implementations, the wafer holder body 112 is a flat cylinder. The wafer attachment member 114 is attached to the bottom surface of the wafer holder body 112. The wafer 132 is beneath and attached to the wafer attachment member 114. In the example of FIG. 1, the wafer attachment member 114 has a size comparable to but slightly larger than that of the wafer 132.

In the example shown in FIG. 1, the base structure 118 includes, among other things, an annular member 120, a contact ring 122, and a pair of shield structures 124. The base structure 118 is configured to support the wafer 132 and protect the wafer 132 and the wafer holder assembly 108. The annular member 120 is an annular structure concentrically around the wafer attachment member 114 and the wafer 132. The contact ring 122 is attached to the inner surface of the annular member 120. The contact ring 122 is in contact with the edge of the wafer 132, therefore, providing the electrical connection between the wafer 132 and a low potential (i.e., causing the wafer to act as a cathode that attracts positive ions) provided by a power supply. In some implementations, the height of the contact ring 122 in the vertical direction is lower than that of the annular member 120. In some implementations, the height of the contact ring 122 in the vertical direction is comparable to but slightly lower than that of the annular member 120. In other words, there may be right-angle corners at the intersection area between the annular member 120 and the contact ring 122. As explained above, plating solution residual 130 may accumulate at those right-angle corners over time and may be hard to clean using conventional approaches. In some embodiments, the base structure may further include an annular plate 126, and both the annular member 120 and the contact ring 122 are attached to the upper surface of the annular plate 126. As a result, the stability of the base structure 118 may be increased.

In the example shown in FIG. 1, the pair of shield structures 124 include a first shield structure 124a and a second shield structure 124b arranged in an opposite manner. The pair of shield structures 124 are attached to the upper surface of the annular member 120 and extend in the vertical direction. The shield structures 124 are configured to protect the wafer holder assembly 108 and the wafer 132. Details of the pair of shield structures 124 in accordance with some embodiments will be described below with reference to FIGS. 3-6.

The base structure 118, the wafer holder assembly 108, and the wafer 132 there-between can move together in the vertical direction, as denoted as the vertical movement 192 in FIG. 1. For instance, during the electroplating process, the base structure 118 and the wafer 132 are immersed in the plating solution 104. Additionally, the wafer holder assembly 108 can move, relative to the base structure 118, in the vertical direction, as denoted as the vertical movement 194 in FIG. 1. As such, the wafer holder assembly 108 can be separated from the base structure 118 a bit when needed, which is helpful in situations like maintenance. On the other hand, the wafer holder assembly 108, the wafer 132, and the base structure 118 can rotate at the same speed, as denoted as the rotational movement 196 in FIG. 1.

FIG. 2 is a diagram illustrating the example electroplating system 100 shown in FIG. 1 in a cleaning procedure in accordance with some embodiments. In the example of FIG. 2, the wafer 132 of FIG. 1 has been removed after the electroplating process, and the base structure 118 and the wafer holder assembly 108 have been pulled out of the plating solution 104, using the vertical movement 192, for cleaning. During the cleaning procedure, the cleaning nozzle 128 ejects cleaning liquid (e.g., water) toward the base structure 118, and the wafer holder assembly 108 and the base structure 118 are rotating in the meantime. The combination of the cleaning liquid flow and the centrifugal force resulted from the rotation drives the plating solution residual 130 out of the base structure 118 and the wafer holder assembly 108. Details of how the pair of shield structures 124 improve the cleaning performance in accordance with some embodiments will be described below with reference to FIGS. 3-6.

Figure 3:
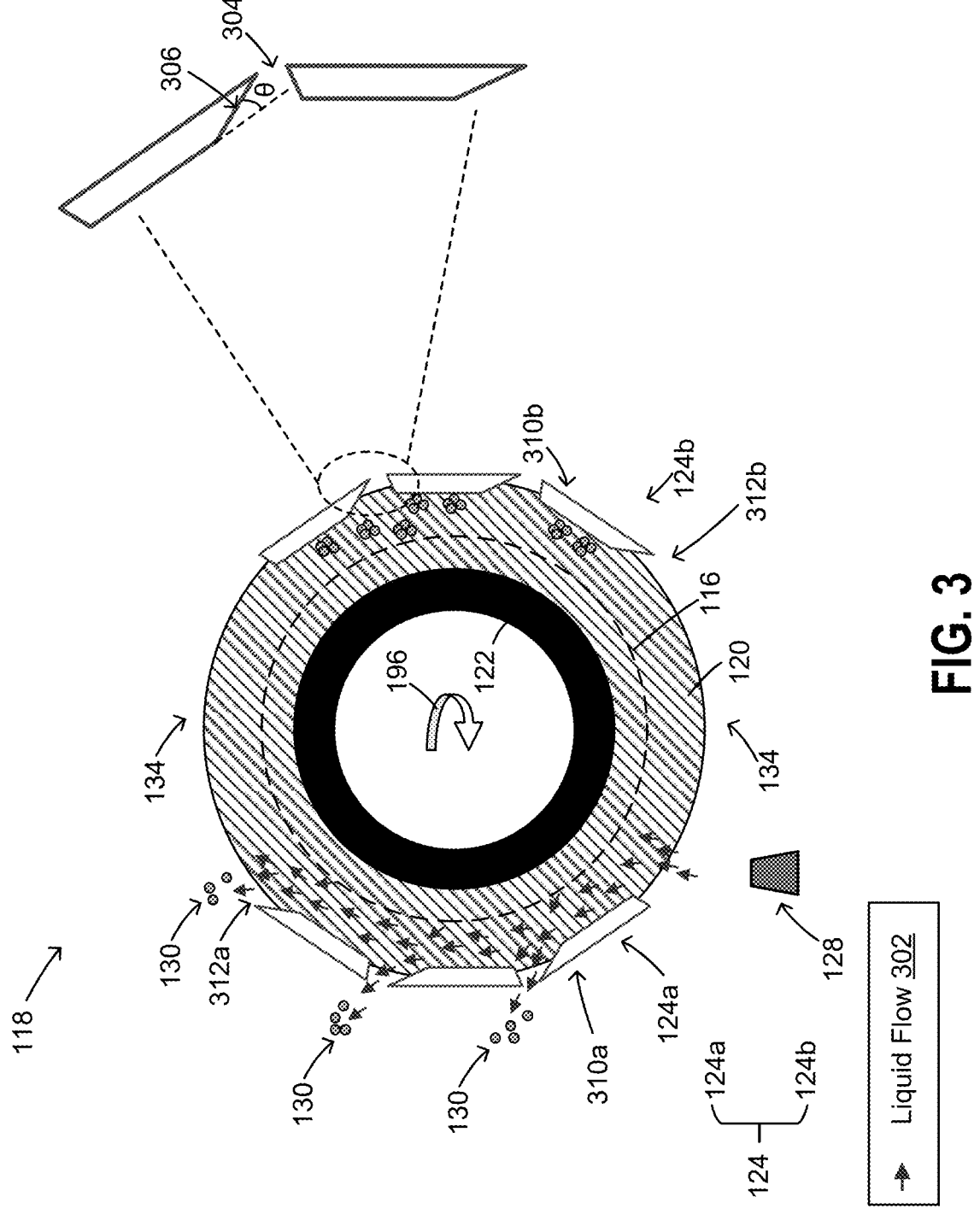
FIG. 3 is a diagram illustrating a schematic top view of the base structure shown in FIG. 1 in accordance with some embodiments.

FIG. 3 is a diagram illustrating a schematic top view of the base structure 118 of FIG. 1 in accordance with some embodiments. As shown in FIG. 3, the contact ring 122 is attached to the inner surface of the annular member 120, whereas the first shield structure 124a and the second shield structure 124b are attached to the upper surface of the annular member 120. In the example of FIG. 3, the first shield structure 124a and the second shield structure 124b are situated, opposite to each other, at the circumference of the outer surface of the annular member 120. The openings 134 are designed to make it easier to operate the wafer holder assembly 108 and the wafer 132 without blocking them. It should be noted that the position of the pair of shield structures 124 may be adjusted along the radial direction (i.e., closer to the center of the annular member 120 or farther from the center of the annular member 120) in other implementations. Likewise, it should be noted that the size of the openings 134, relative to the pair of shield structures 124, may be adjusted in other implementations. It should be noted that, although the example in FIGS. 1-3 is directed to the case of two shield structures 124, other numbers of shield structures are within the scope of the disclosure.

In the example shown in FIG. 3, the first shield structure 124a and the second shield structure 124b have the same structure. The second shield structure 124b can be regarded as the first shield structure 124a with a 180-degree rotation in the clockwise direction. As such, the description below is directed to one of the first shield structure 124a and the second shield structure 124b for simplicity.

In the example shown in FIG. 3, the second shield structure 124b includes a curved plate 310b. The curved plate 310b extends in the vertical direction. In some implementations, the curved plate 310b is aligned with the outer surface of the annular member 120, in the top view. In other words, the curved plate 310b is a portion of the cylindrical surface of a right circular cylinder. It should be noted that, in other implementations, the curved plate 310b may have other geometries as needed, which are also within the scope of the disclosure.

The curved plate 310b has multiple discharging openings 304. The discharging openings 304 are configured to discharge the plating solution residual 130 in the cleaning procedure. In the example of FIG. 3, there are two discharging openings 304. In some embodiments, the number of discharging openings 304 is one. In other embodiments, the number of discharging openings 304 is three. In yet other embodiments, the number of discharging openings 304 is between four and six. In still some other examples, the number of discharging openings 304 is more or fewer than the numbers mentioned above. Thus, it will be understood by one skilled in the art that, the number of discharging opening 304 is not specifically limited in the present disclosure.

As shown in the enlarged portion of the second shield structure 124b in FIG. 3, for each discharging opening 304, there is a corresponding bevel (also referred to as a "slope") 306. The bevel 306 begins at an inner surface of the curved plate 310b and ends at the corresponding discharging opening 304. In one implementation, the bevel 306 is a slope, and the bevel 306 is cut in the curved plate 310b at an angle θ, in the top view. The angle θ is an angle between the bevel 306 and the tangential surface (denoted in the dashed line in FIG. 3) of the curved plate 310b. The bevels 306 can guide the plating solution residual 130 toward corresponding discharging openings 304, therefore, increasing the discharging efficiency of the plating solution residual 130. It should be noted that the bevel 306 may be a curved surface in other implementations.

During a cleaning procedure, the cleaning nozzle 128 ejects cleaning liquid toward the base structure 118. The liquid flow 302 is schematically illustrated as arrows in FIG. 3. The liquid flow 302 may hit the outer surface 116 (as denoted as the dashed circle in FIG. 3) of the wafer holder body 112 (as shown in FIG. 1) and bound back toward the curved plate 310a of the first shield structure 124a. As a result, the liquid flow 302 collectively advances through the gap between the outer surface 116 of the wafer holder body 112 and the first shield structure 124a.

The liquid flow 302 flushes the plating solution residual 130 accumulated in the base structure 118. The bevels 306 guide the liquid flow 302 toward corresponding discharging openings 130. As such, the plating solution residual 130 is driven out of the base structure 118 through the bevels 306 and corresponding discharging openings 304. Without the bevels 306 and the discharging openings 304, the plating solution residual 130 would have to advance through a long path before it can exit the base structure 118 at the distal end 312a of the first shield structure 124a. As such, the existence of the bevels 306 and corresponding discharging openings 304 significantly increases the discharging efficiency of the plating solution residual 130.

On the other hand, in addition to the liquid flow 302, the centrifugal force due to the rotation of the base structure 118 also drives the plating solution residual 130 towards the bevels 306 and corresponding discharging openings 304. The faster the base structure 118 rotates, the larger the centrifugal force is.

It should be noted that the number of discharging openings 304 on the shield structure 124a may be selected based on the following considerations. If the number of discharging openings 304 is relatively large, it is easier to drive the plating solution residual 130 out of the base structure 118, but it may consume more cleaning liquid to have enough cleaning liquid that can arrive at the distal end 312a. If the number of discharging openings 304 is relatively small, it is harder to drive the plating solution residual 130 out of the base structure 118, but it may consume less cleaning liquid to have enough cleaning liquid that can arrive at the distal end 312a. Accordingly, the number of discharging openings 304 may be a result of a tradeoff between discharging efficiency and cleaning liquid consumption. Again, in the example of FIG. 3, the optimal number of discharging openings 304 is two, though other optimal numbers may be employed in accordance with different parameters of the electroplating system 100 such as the rotation speed, the flow rate coming out of the cleaning nozzle 128. A method can be employed to determine the optimal number of discharging openings 304 using a trial-and-error approach. An alternative method can be employed to determine the optimal number of discharging openings 304 using simulation tools.

Similar considerations mentioned in the previous paragraph can be applied to the choice of the size of the discharging openings 304, which will not be described in detail again. Generally speaking, the larger the discharging openings 304 are, the higher the discharging efficiency is, at the expense of larger cleaning liquid consumption.

Figure 4A:
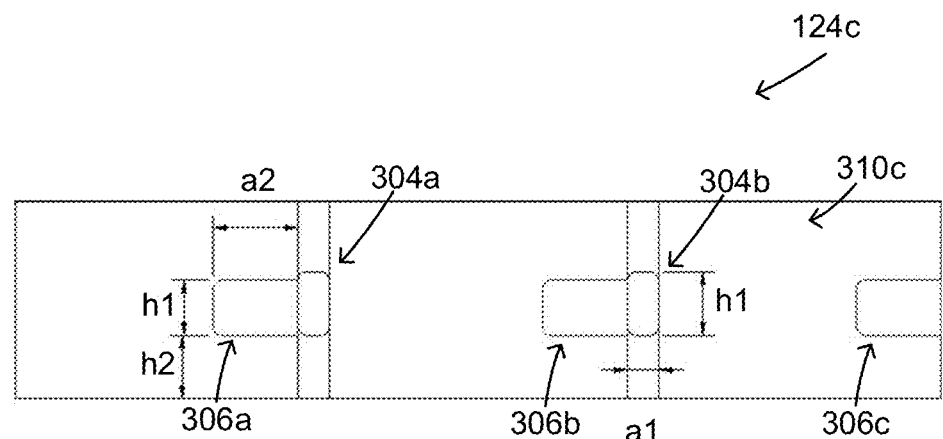
FIG. 4A is a side view of an example shield structure in accordance with some embodiments.
Figure 4B:
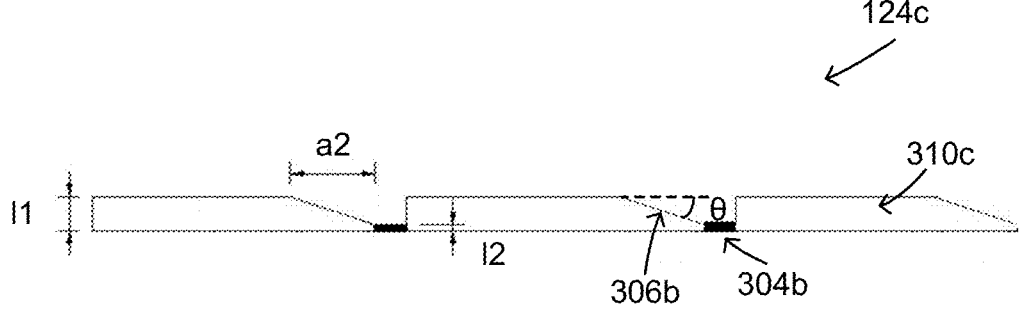
FIG. 4B is a top view of the example shield structure shown in FIG. 4A in accordance with some embodiments.

FIG. 4A is a side view of an example shield structure 124c in accordance with some embodiments. FIG. 4B is a top view of the example shield structure 124c of FIG. 4A in accordance with some embodiments. It should be noted that the curved place 310 is illustrated as flat for simplicity. As shown in FIGS. 4A and 4B, the discharging openings 304a and 304b are located in the curved plate 310c. In the example in FIGS. 4A and 4B, the discharging openings 304a and 304b are situated at the same height h2 in the vertical direction. The discharging openings 304a and 304b have the same width a1 and the same height h1. The bevels 306a and 306b correspond to the discharging openings 304a and 304b, respectively. The bevels 306a and 306b have the same height h1 as those of the discharging openings 304a and 304b. The bevels 305a and 306b have the same width a2. In the example in FIGS. 4A and 4B, a2 is larger than a1. In other examples, a2 may be smaller than a1. In yet other examples, a2 may be equal to a1.

In the top view shown in FIG. 4B, the angle θ is determined by the width a2 and the thickness (l1–l2), in accordance with the equation tan θ=(l1–l2)/a2. In other words, the angle θ may be adjusted as needed by adjusting one or more of the dimensional parameters a2, l1, and l2. Likewise, the optimal value of the angle θ may be determined using a trial-and-error approach or simulation tools, in view of the tradeoff between discharging efficiency and cleaning liquid consumption.

In a non-limiting example, the following set of dimensional parameters of the shield structure 124c are determined: a1 is equal to 7 cm; a2 ranges from 5 cm to 30 cm; h2 is equal to 15 cm; h1 ranges from 5 cm to 20 cm; l2 is equal to 8 cm; the angle θ ranges from 20 degrees to 50 degrees.

Figure 5:
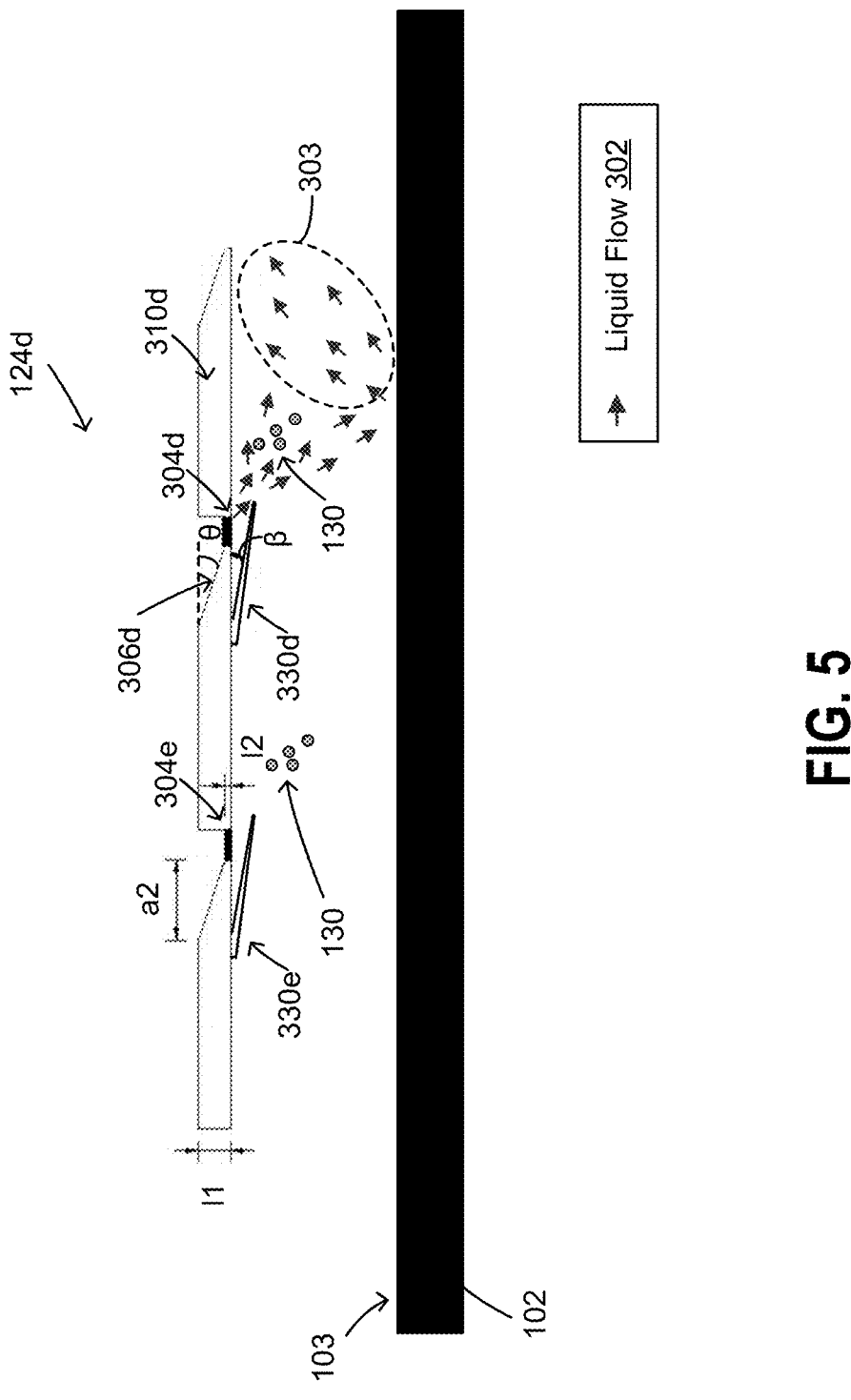
FIG. 5 is a top view of an example shield structure in accordance with some embodiments.

FIG. 5 is a top view of an example shield structure 124d in accordance with some embodiments. The example shield structure 124d is identical to the example shield structure 124c except that the shield structure 124d includes multiple baffles 330d and 330e (collectively, 330). The baffles 330d and 330e correspond to discharging openings 304d and 304e, respectively. Each of the baffles 330 has one end attached to the curved plate 310d and another end extending outward radially. The angle between the baffle 330d and the tangential surface of the curved plate 310d is β. The baffle 330d may protect the corresponding discharging opening 304d by preventing rebounding liquid flow 303 from reentering the discharging opening 304d. As shown in FIG. 5, the liquid flow 302 may rebound at the inner surface 103 of the container 102 and move toward the shield structure 124d. For instance, the rebounding liquid flow 303 coming out of the discharging opening 304e may reenter the shield structure 124d through the neighboring discharging opening 304d if there is no baffle 330d. As such, the baffles 330 can prevent cleaning liquid and plating solution residual 130 from reentering the shield structure 124d through the discharging openings 304d and 304e, thus increasing discharging efficiency and securing cleaning performance.

Likewise, the optimal value of the angle β may be determined using a trial-and-error approach or simulation tools. In one non-limiting example, the angle β ranges from 5 degrees to 45 degrees.

According to some experimental data, the usage (e.g., available time) of the electroplating system is increased by 1.1%; applied engineer loading is reduced by 36 hours per month; scrap reduction operations are reduced by two times per year.

FIG. 6 is an example method 600 of manufacturing a base structure in an electroplating system in accordance with some embodiments. The method 600 includes operations 602, 604, 606, 608, 610, and 612.

At operation 602, an annular member (e.g., the annular member 120 in FIG. 3) is provided. At operation 604, a contact ring (e.g., the contact ring 122 in FIG. 3) is attached to the inner surface of the annular member. The contact ring is capable of being electrically connected to a wafer in a cleaning procedure. At operation 606, a pair of shield structures (e.g., the shield structures 124a and 124b in FIG. 3) are attached to an upper surface of the annular member. The pair of shield structures extend in a vertical direction. For each shield structure, at operation 608, a plurality of discharging openings (e.g., the discharging openings 304 in FIG. 3) is formed in a curved plate (e.g., the curved planes 310a and 310b in FIG. 3) of each of the shield structures. For each shield structure, at operation 610, a plurality of bevels (e.g., the bevels 306 in FIG. 3), corresponding to the plurality of discharging openings, respectively, are formed in the curved plate of each of the shield structures. In some embodiments, for each shield structure, at operation 612, a plurality of baffles (e.g., the baffles 330d and 330e in FIG. 5), corresponding to the plurality of discharging openings, respectively, to the curved plate of each of the shield structures.

It should be noted that the order of the operations in the method 600 is not constrained to that shown in FIG. 6 or described herein. Several of the operations could occur in a different order without affecting the final result.

Figure 7:
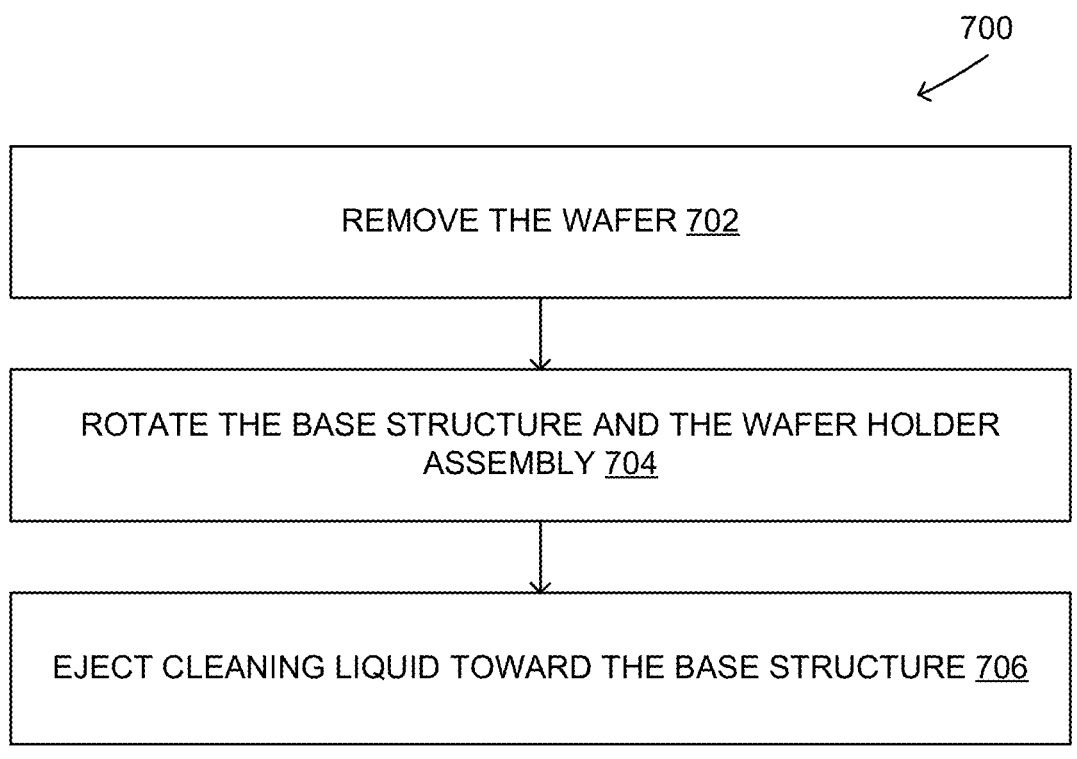
FIG. 7 is an example method of cleaning the electroplating system shown in FIG. 2 in accordance with some embodiments.

FIG. 7 is an example method 700 of cleaning the electroplating system of FIG. 2 in accordance with some embodiments. The method 700 includes operations 702, 704, and 706. At operation 702, the wafer (e.g., the wafer 132 in FIG. 2) is removed. At operation 704, the base structure (e.g., the base structure 118 in FIG. 2) and the wafer holder assembly (e.g., the wafer holder assembly 108 in FIG. 2) are rotated. At operation 706, cleaning liquid is ejected toward the based structure. In one implementation, the cleaning liquid is ejected by a cleaning nozzle (e.g., the cleaning nozzle 128 in FIG. 2). It should be noted that the order of the operations in the method 600 is not constrained to that shown in FIG. 6 or described herein. Several of the operations could occur in a different order without affecting the final result.

In accordance with some aspects of the disclosure, a base structure in an electroplating system is provided. The base structure includes: an annular member; a contact ring attached to an inner surface of the annular member and configured to be electrically connected to a wafer in an electroplating process; and a pair of shield structures attached to an upper surface of the annular member and extending in an vertical direction. Each of the pair of shield structures includes: a curved plate comprising a plurality of discharging openings, wherein plating solution residual is discharged through the plurality of discharging openings in a cleaning procedure; and a plurality of bevels, each of the plurality of bevels corresponding to each of the plurality of discharging openings and configured to guide the plating solution residual toward the corresponding discharging opening in the cleaning procedure.

In accordance with some aspects of the disclosure, a method of manufacturing a base structure in an electroplating system is provided. The method includes the following operations: providing an annular member; attaching a contact ring capable of being electrically connected to a wafer in An electroplating process to an inner surface of the annular member; attaching a pair of shield structures, extending in an vertical direction, to an upper surface of the annular member; forming a plurality of discharging openings in a curved plate of each of the shield structures; and forming a plurality of bevels, corresponding to the plurality of discharging openings, respectively, in the curved plate of each of the shield structures.

In accordance with some aspects of the disclosure, an electroplating system is provided. The electroplating system includes: a container; a plating solution in the container; an anode connected to a first electric potential; a wafer holder assembly, capable of rotating and configured to hold a wafer during an electroplating process; and a base structure. The base structure includes: an annular member; a contact ring attached to an inner surface of the annular member and configured to be electrically connected between the wafer and a second electric potential lower than the first electric potential during the electroplating process; and a pair of shield structures attached to an upper surface of the annular member and extending in an vertical direction. Each of the pair of shield structures includes: a curved plate comprising a plurality of discharging openings, wherein plating solution residual is discharged through the plurality of discharging openings in a cleaning procedure; and a plurality of bevels, each of the plurality of bevels corresponding to each of the plurality of discharging openings and configured to guide the plating solution residual toward the corresponding discharging opening in the cleaning procedure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A base structure in an electroplating system comprising:

an annular member;

a contact ring attached to an inner surface of the annular member and configured to be electrically connected to a wafer in an electroplating process; and a pair of shield structures attached to an upper surface of the annular member and extending in a vertical direction, each of the pair of shield structures comprising:

a curved plate comprising a plurality of discharging openings, wherein plating solution residual is discharged through the plurality of discharging openings in a cleaning procedure; and a plurality of bevels, each of the plurality of bevels corresponding to each of the plurality of discharging openings and configured to guide the plating solution residual toward the corresponding discharging opening in the cleaning procedure.

2. The base structure of claim 1, wherein the plating solution residual is discharged by using one or more of:

rotating the base structure; and ejecting cleaning liquid toward the base structure.

3. The base structure of claim 1, wherein the curved plate is aligned with an outer surface of the annular member when viewing from above.

4. The base structure of claim 1, wherein the plurality of discharging openings are situated at a same height in the vertical direction.

5. The base structure of claim 1, wherein each of the plurality of bevels begins at an inner surface of the curved plate and ends at the corresponding discharging opening.

6. The base structure of claim 5, wherein each of the plurality of bevels is a slope.

7. The base structure of claim 6, wherein an angle between the slope and a tangential surface of the curved plate is between 20 degrees and 50 degrees.

8. The base structure of claim 1, wherein each of the plurality of bevel and the corresponding discharging opening has a same height in the vertical direction.

9. The base structure of claim 1, wherein the plurality of discharging openings are two discharging openings.

10. The base structure of claim 1, wherein each of the pair of shield structures further comprises:

a plurality of baffles, each of the plurality of baffles corresponding to each of the plurality of discharging openings and configured to prevent the plating solution residual from reentering the base structure through the plurality of discharging openings.

11. The base structure of claim 10, wherein an angle between each of the plurality of baffles and a tangential surface of the curved plate is between 5 degrees and 45 degrees.

12. The base structure of claim 1, wherein the pair of shield structures are situated, opposite to each other, at a circumference of an outer surface of the annular member.

13. A method of manufacturing a base structure in an electroplating system comprising:

providing an annular member;

attaching a contact ring capable of being electrically connected to a wafer in an electroplating process to an inner surface of the annular member;

attaching a pair of shield structures, extending in a vertical direction, to an upper surface of the annular member;

forming a plurality of discharging openings in a curved plate of each of the shield structures; and forming a plurality of bevels, corresponding to the plurality of discharging openings, respectively, in the curved plate of each of the shield structures.

14. The method of claim 13, wherein each of the plurality of bevels is configured to guide plating solution residual toward the corresponding discharging opening in a cleaning procedure.

15. The method of claim 14, wherein the plating solution residual is discharged through the plurality of discharging openings in the cleaning procedure.

16. The method of claim 13, wherein each of the plurality of bevels is a slope and an angle between the slope and a tangential surface of the curved plate of each of the shield structures is between 20 degrees and 50 degrees.

17. The method of claim 13 further comprising:

attaching a plurality of baffles, corresponding to the plurality of discharging openings, respectively, to the curved plate of each of the shield structures.

18. The method of claim 17, wherein an angle between each of the plurality of baffles and a tangential surface of the curved plate of each of the shield structures is between 5 degrees and 45 degrees.

19. A base structure of an electroplating system, the base structure comprising:

an annular member having an inner surface, an upper surface;

a contact ring attached to the inner surface of the annular member and operable to be electrically connected to a wafer during an electroplating process; and at least one shield structure attached to the upper surface of the annular member and extending in a vertical direction, each of the at least one shield structure comprising:

a curved plate comprising a plurality of discharging openings operable to discharge plating solution residual through the plurality of discharging openings during a cleaning procedure; and a plurality of bevels, each of the plurality of bevels corresponding to one of the plurality of discharging openings and operable to guide the plating solution residual toward the corresponding discharging opening in the cleaning procedure.

20. The base structure of claim 19, wherein the curved plate is aligned with an outer surface of the annular member.

* * * * *